United States Patent
Jeong

Patent Number: 6,137,551
Date of Patent: *Oct. 24, 2000

[54] LIQUID CRYSTAL DISPLAY, THIN FILM TRANSISTOR ARRAY, AND METHOD OF FABRICATING SAME WITH STORAGE CAPACITOR PROVIDING HIGH ASPECT RATIO

[75] Inventor: Kwoan-Yel Jeong, Kyungsangbuk-do, Rep. of Korea

[73] Assignee: Hyundai Electronics Industries Co., Ltd., Kyoungki-do, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/994,436
[22] Filed: Dec. 19, 1997

[30] Foreign Application Priority Data

Feb. 20, 1997 [KR] Rep. of Korea ............... 97-5144

[51] Int. Cl.[7] .............. G02F 1/1343; G02F 1/136; G02F 1/13; H01L 29/04
[52] U.S. Cl. .............. 349/38; 349/39; 349/42; 349/43; 349/187; 257/59; 257/72
[58] Field of Search ............... 349/38, 39, 42, 349/43, 187; 257/72, 59

[56] References Cited

U.S. PATENT DOCUMENTS

| | | | |
|---|---|---|---|
| 5,517,342 | 5/1996 | Kim et al. | 359/59 |
| 5,672,888 | 9/1997 | Nakamura | 257/72 |
| 5,724,107 | 3/1998 | Nishikawa et al. | 349/38 |
| 5,734,449 | 3/1998 | Jang | 349/39 |
| 5,757,453 | 5/1998 | Shin et al. | 349/138 |
| 5,780,871 | 7/1998 | Den Boer et al. | 257/59 |
| 5,796,448 | 8/1998 | Kim | 349/39 |
| 5,859,683 | 1/1999 | Tagusa et al. | 349/138 |
| 5,920,362 | 7/1999 | Lee | 349/38 |
| 5,923,390 | 7/1999 | Jung Mok et al. | 349/38 |
| 5,926,240 | 7/1999 | Hirotal et al. | 349/114 |
| 5,953,085 | 9/1999 | Shimada | 349/39 |
| 6,057,896 | 5/2000 | Rho et al. | 349/42 |

OTHER PUBLICATIONS

H. Toeda et al., "A high aperture and high density a–Si TFT–LCD with a new pixel structure," IEDM 93–401, pp. 401–404. (1993).

*Primary Examiner*—William L. Sikes
*Assistant Examiner*—Tarifur R. Chowdhury
*Attorney, Agent, or Firm*—Morgan, Lewis & Bockius LLP

[57] ABSTRACT

A liquid crystal display includes a substrate, a plurality of gate lines disposed over the substrate, a plurality of data lines intersecting the plurality of gate lines over the substrate, and a plurality of switching elements each having an active layer formed of a semiconductor materials and connected to the gate line and the data line, operation of the switching element being controlled by signals from the gate line connected to the switching element. The liquid crystal display further includes a plurality of pixel electrodes each connected to each of the plurality of switching elements, signals from the data line being transmitted to the pixel electrode in accordance with the operation of the switching element, a storage electrode opposite to the pixel electrode, the storage electrode being formed of the same semiconductor material as that of the active layer, and at least one dielectric layer between the storage electrode and the opposing pixel electrode, the storage electrode and the opposing pixel electrode along with the at least one dielectric layer forming a storage capacitor.

27 Claims, 5 Drawing Sheets

LIQUID CRYSTAL DISPLAY, THIN FILM TRANSISTOR ARRAY, AND METHOD OF FABRICATING SAME WITH STORAGE CAPACITOR PROVIDING HIGH ASPECT RATIO

This application claims the benefit of Korean Patent Application No. 97-5144, filed in Korea on Feb. 20, 1997, which is hereby incorporated by reference.

BACKGROUND OF THE INVENTION

1. Field of the Invention

The present invention relates to a liquid crystal display (LCD) and a method of fabricating the same, and more particularly, to an LCD and a method of fabricating the same having storage capacitors with a high aperture ratio.

2. Discussion of the Related Art

An LCD is fabricated through a process including the steps of preparing a lower substrate on which gate lines, data lines, pixel electrodes, and switching elements, such as thin film transistors, for controlling the electric field applied to the pixel electrode are arranged in the form of a matrix; preparing an upper substrate on which a common electrode and color filters are formed; injecting a liquid crystal between the upper and lower substrates and sealing it to thereby bond the two substrates; forming polarizing plates on the outer surfaces of the two substrates; mounting a driving circuit chip on the lower substrate; and installing a back light on one of the polarizing plates.

Conventionally, the gate lines and the data lines intersect each other to form a pixel array on the lower substrate in the form of a matrix. Each pixel includes a thin film transistor connected to adjacent gate and data lines and a pixel electrode connected to one of the electrodes of the thin film transistor.

An aperture ratio is the ratio of an area where light is transmitted with respect to the entire pixel area. The picture quality of the LCD depends on the aperture ratio. Therefore, it is desirable to increase the aperture ratio by increasing the area of the pixel area where light is transmitted. However, more than 50% of the consumption power required to drive the LCD is generated by the back light. Thus, an LCD structure that has a higher aperture ratio can also reduce the power consumed by the back light.

Figure 1:
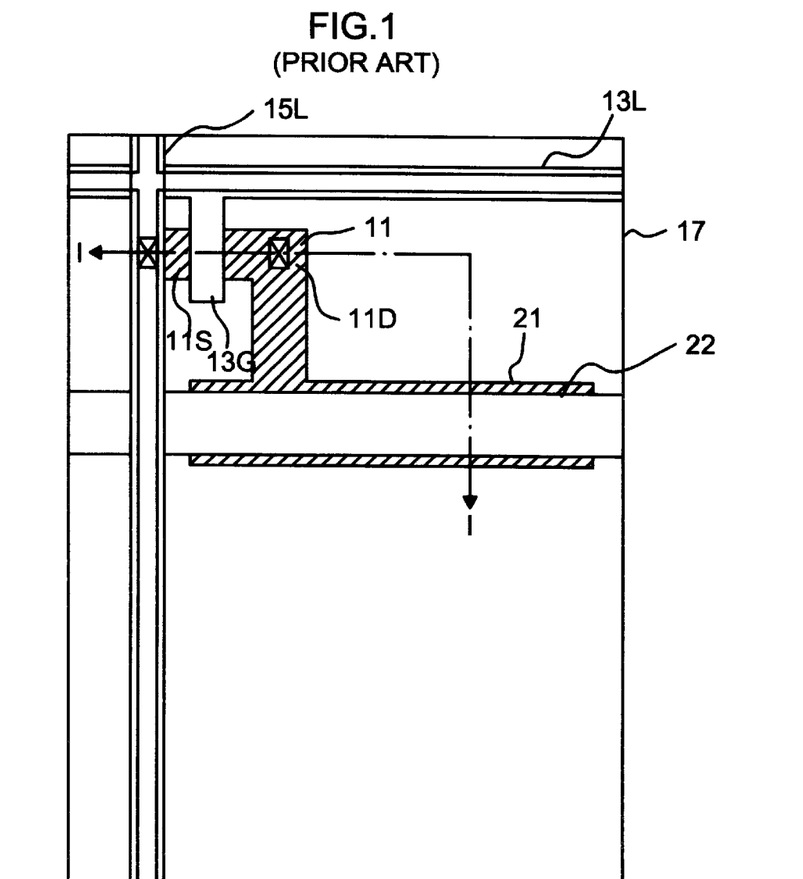
FIG. 1 is a plan view of a conventional LCD.

FIG. 1 is a plan view of a conventional LCD. FIG. 1 shows one pixel region defined by a gate line 13L and data line 15L which cross or intersect each other. Referring to FIG. 1, a gate electrode 13G is connected to gate line 13L. An active layer 11 traverses gate electrode 13G. A source region 11S is formed in a portion of active layer 11 at one side of gate electrode 13G, and a drain region 13D is formed at a portion of active region 11 at the other side of the gate electrode. Source region 11S is connected to data line 15L, and drain region 11D is connected to a pixel electrode 17, which covers the overall pixel region. Thus, a data signal applied through data line 15L reaches pixel electrode 17 through source and drain regions 11S, 11D.

A storage capacitor is formed near the center of the pixel. A first storage electrode 21 and active layer 11 are formed of the same material at the same layer level. A second storage electrode 22 and gate line 13L are formed of the same material at the same layer level. The second storage electrode 22 is superposed on the first storage electrode 21.

Figure 2:
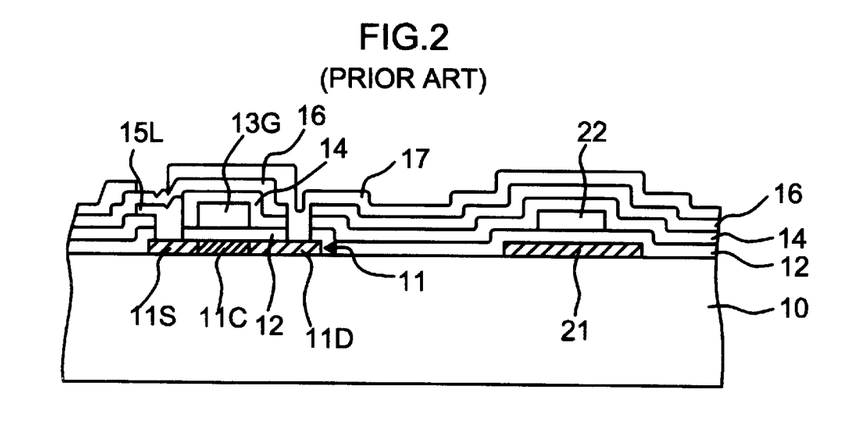
FIG. 2 is a cross-sectional view taken along line I—I of FIG. 1.

FIG. 2 is a cross-sectional view taken along line I—I of FIG. 1. Referring to FIG. 2, the active layer 11 and the first storage electrode 21 are formed of the same material on a glass substrate 10, and a gate insulating layer 12 is formed thereon. The gate electrode 13G and the second storage electrode 22 are formed of the same material on gate insulating layer 12. The gate electrode 13G defines a channel region 11C in active layer 11, and the second storage electrode 22 is superposed on the first storage electrode 21. Moreover, a first interlevel insulating layer 14 is formed on the overall surface of the substrate. Data line 15L is formed on the first interlevel insulating layer 14 to be connected to source region 11S through a contact hole formed in predetermined portions of the gate insulating layer 12 and the first interlevel insulating layer 14.

A second interlevel insulating layer 16 is formed on the overall surface of the substrate. Pixel electrode 17 is formed on the second interlevel insulating layer 16 to be connected to drain region 11D through a contact hole formed in predetermined portions of gate insulating layer 12 and the first and second interlevel insulating layers 14, 16. FIG. 2 shows a cross-section of the storage capacitor including the first storage electrode 21, the gate insulating layer 12, and the second storage electrode 22.

In the aforementioned conventional LCD, the second storage electrode is formed of a metal through which light cannot be transmitted, and is disposed near the center of the pixel region, sacrificing the aperture ratio of the pixel.

Figure 3:
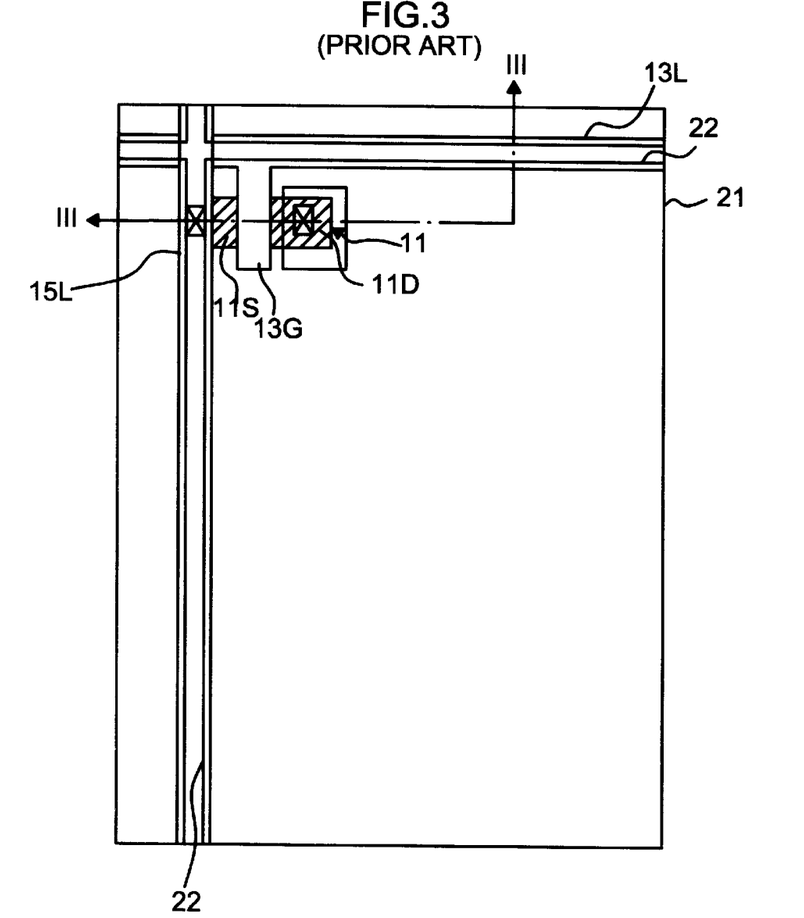
FIG. 3 is a plan view of another conventional LCD.

FIG. 3 is a plan view of another conventional LCD. FIG. 3 shows one pixel region defined by a gate line 13L and a data line 15L, which cross each other. Referring to FIG. 3, gate electrode 13G is connected to gate line 13L. Active layer 11 traverses the gate electrode 13G. Source region 11S is formed in a portion of active region 11 on one side of gate electrode 13G. Drain region 11D is formed in a portion of active region 11 on the other side of the gate electrode. The source region 11S is connected to date line 15L, and the drain region 11D is connected to pixel electrode 22, which covers the overall pixel region. Thus, a data signal applied through data line 11L reaches pixel electrode 22 through source and drain regions 11S, 11D.

The storage capacitor is formed over the overall pixel region, except drain region 11D. A first storage electrode 21 is formed of a transparent conductive material, such as Indium Tin Oxide (ITO). Pixel electrode 22 superposed on the first storage electrode 21 is used as a second storage electrode. In this example, the aperture ratio of this LCD is much higher than that of the above-described LCD, because the electrodes of the storage capacitor are formed of transparent conductive material. An opening exposing drain region 11D is formed in a predetermined portion of the first storage electrode 21 to allow the drain region 11D to be connected with the pixel electrode 22 placed over the first storage electrode 21.

Figure 4:
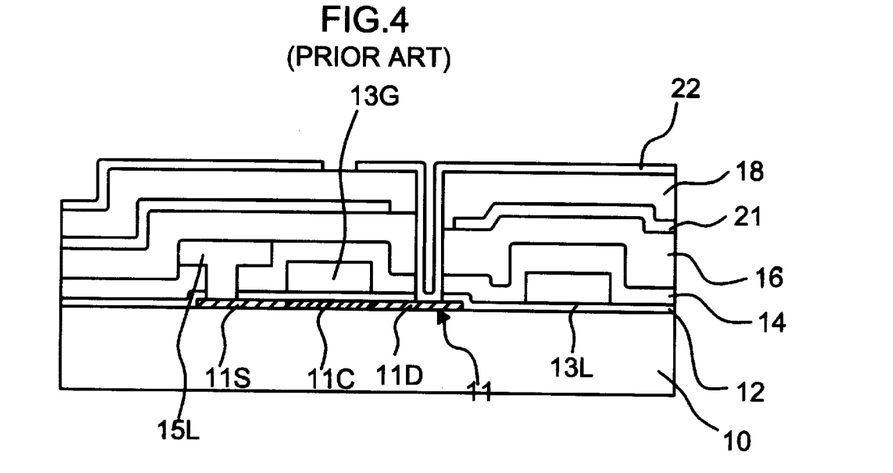
FIG. 4 is a cross-sectional view taken along line III—III of FIG. 3.

FIG. 4 is a cross-sectional view taken along line III—III of FIG. 3. Referring to FIG. 4, active layer 11 is formed on a glass substrate 10, and a gate insulating layer 12 is formed thereon. Gate electrode 13G and gate line 13L are formed on the gate insulating layer 12, and the first interlevel insulating layer 14 is formed thereon. The gate electrode 13G defines a channel region 11C in active layer 11. Data line 15L is formed on the first interlevel insulating layer 14 to be connected to source region 11S through a contact hole formed in predetermined portions of the gate insulating layer 12 and the first interlevel insulating layer 14. A second interlevel insulating layer 16 is formed on the overall surface of the substrate. A first storage electrode 21 is formed of a transparent conductive material on the second interlevel insulating layer 16. Here, the first storage electrode 21 is not superposed on the drain region 11D and has an opening surrounding the drain region 11D, as described above.

Thereafter, a third interlevel insulating layer 18 is formed on the second interlevel insulating layer 16. A pixel electrode 22 is formed on the third interlevel insulating layer 18 to be connected to drain region 11D through a contact hole formed in predetermined portions of gate insulating layer 12, the first, second, and third interlevel insulating layers 14, 16, 18. FIG. 4 shows the cross-section of the storage capacitor including the first storage electrode 21, the third interlevel insulating layer 18, and the second storage electrode 22.

The aperture ratio of this LCD is much higher than that of the above-described LCD, as seen from FIG. 3, because the electrodes of the storage capacitor are formed of a transparent material. However, this LCD structure requires an extra third interlevel insulating layer and an extra first storage electrode. Thus, additional deposition and photolithography processes are necessary. These processes are complicated and difficult to perform, thereby resulting in poor production yield.

SUMMARY OF THE INVENTION

Accordingly, the present invention is directed to an LCD and a method of fabricating the same that substantially obviate the problems due to limitations and disadvantages of the related art.

An object of the present invention is to provide a liquid crystal display having a larger aperture ratio without introducing complicated structures.

Another object of the present invention is to provide a method of fabricating a liquid crystal display having a larger aperture ratio without introducing complicated processes.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention provides a liquid crystal display, including a substrate; a plurality of gate lines disposed over the substrate; a plurality of data lines intersecting the plurality of gate lines over the substrate; a plurality of switching elements each having an active layer formed of a semiconductor materials and connected to the gate line and the data line, operation of the switching element being controlled by signals from the gate line connected to the switching element; a plurality of pixel electrodes each connected to each of the plurality of switching elements, signals from the data line being transmitted to the pixel electrode in accordance with the operation of the switching element; a storage electrode opposite to the pixel electrode, the storage electrode being formed of the same semiconductor material as that of the active layer; and at least one dielectric layer between the storage electrode and the opposing pixel electrode, the storage electrode and the opposing pixel electrode along with the at least one dielectric layer forming a storage capacitor.

In another aspect, the present invention provides a thin film transistor array substrate for use in a liquid crystal display, including a substrate; a gate line over the substrate; a data line over the substrate; a thin film transistor over the substrate, including an active layer including source and drain regions therein, the active layer being made of a semiconductor material, the source region being connected to the data line; a gate electrode connected to the gate line; and a gate insulating layer between the gate electrode and the active layer; a pixel electrode connected to the drain region of the active layer; a storage electrode disposed opposite to the pixel electrode and made of said semiconductor material, the thickness of the storage electrode being such that the storage electrode is substantially transparent with respect to predetermined radiation; and a dielectric layer between the pixel electrode and the storage electrode, the pixel electrode and the storage electrode along with the dielectric layer defining a capacitor.

In a further aspect, the present invention provides a method of fabricating a liquid crystal display on a substrate, including the steps of concurrently forming an active layer and a storage electrode over the substrate, the active layer and the storage electrode being made of the same semiconductor material; thereafter, forming a first insulating layer over the overall surface of the substrate; forming a gate electrode and a gate line connected thereto over the first insulating layer, the gate electrode crossing the active layer; doping impurities into predetermined portions of the active layer to define source and drain regions in both sides of the active region relative to the gate electrode; forming a second insulating layer over the overall surface of the substrate; forming a first contact hole in predetermined portions of the first and second insulating layers, to expose a portion of the source region; forming a data line over the second insulating layer, the data line being connected to the source region through the first contact hole; thereafter, forming a third insulating layer on the overall surface of the substrate; forming a second contact hole in predetermined portions of the first, second, and third insulating layers, to expose a portion of the drain region; and forming a pixel electrode opposite to the storage electrode over the third insulating layer, the pixel electrode being connected to the drain region through the second contact hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 5:
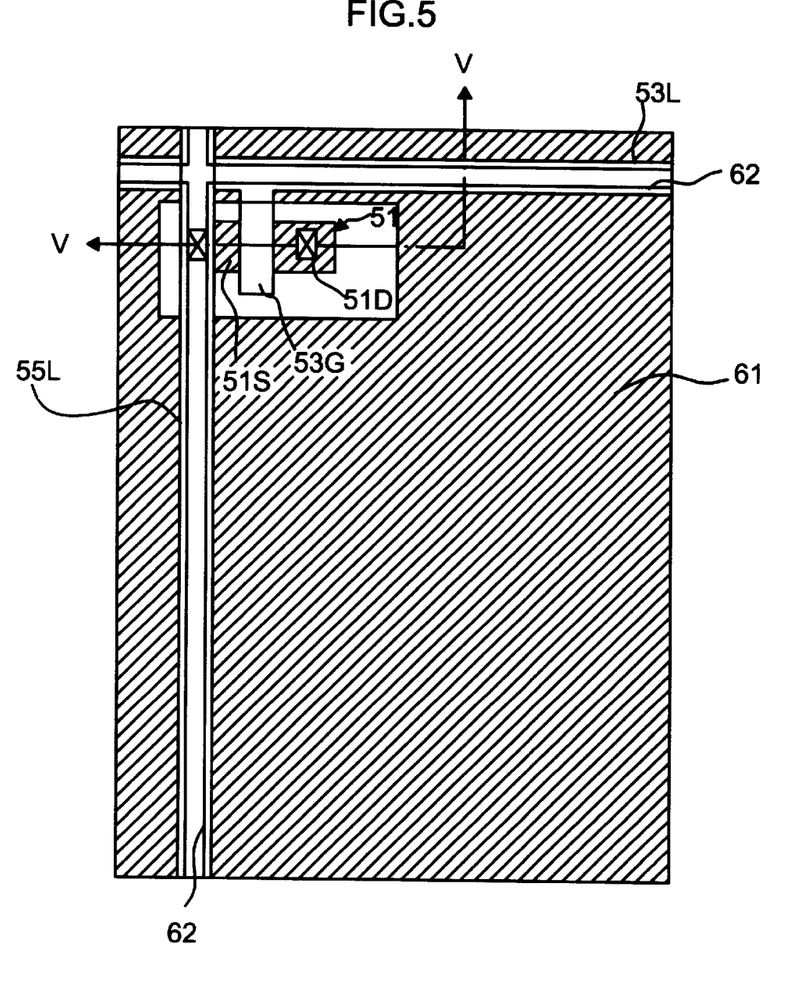
FIG. 5 is a plan view of an LCD according to an embodiment of the present invention.

FIG. 5 is a plan view of an LCD according to an embodiment of the present invention. FIG. 5 shows a portion of one pixel region defined by a gate line 53L and a data line 55L, which cross each other. A gate electrode 53G is connected to the gate line 53L. An active layer 51 is formed under the gate electrode 53G so that they cross each other. A source region 51S is formed in a portion of the active layer 51 on one side of gate electrode 53G. A drain region 51D is formed in a portion of the active layer 51 on the other side of the gate electrode 53G. The source region 51S is electrically connected to the data line 55L. The gate electrode 53G, the source and drain regions 51S, 51D together constitute a switching element.

A first storage electrode 61 covers the overall pixel region excluding an area corresponding to the switching element. The first storage electrode 61 and the active layer 51 are formed of the same material and at the same level. A pixel electrode 62 is connected to drain region 51D and covers the overall pixel region. The pixel electrode 62 is superposed on the first storage electrode 61 and serves as a second storage electrode for the storage capacitor. Since the first storage electrode 61 is formed of amorphous silicon or polycrystalline silicon, which is used as a material for forming the active layer 51, light can be transmitted through it. The pixel electrode 62 used as the second storage electrode is formed of a transparent conductive material, such as ITO.

Figure 6:
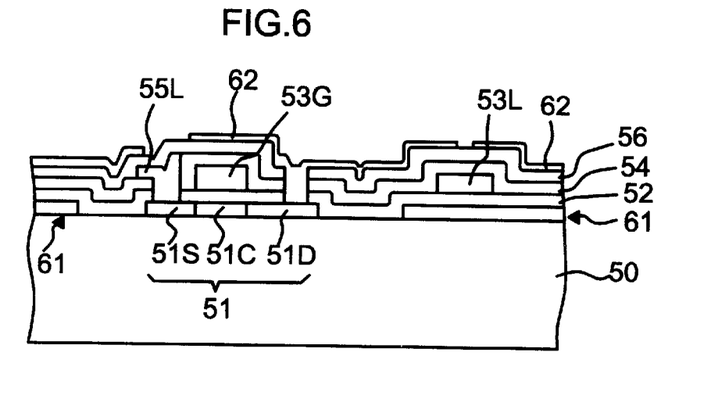
FIG. 6 is a cross-sectional view taken along line V—V of FIG. 5.

FIG. 6 is a cross-sectional view taken along line V—V of FIG. 5. Referring to FIG. 6, the active layer 51 and the first storage electrode 61 are formed of the same material on a glass substrate 50. The first storage electrode 61 is doped with impurity ions to increase its conductivity. The source and drain regions 51S, 51D are also doped with impurity ions. A gate insulating layer 52 is formed on the overall surface of the substrate. The gate electrode 53G and the gate line 53L are formed on gate insulating layer 52, and a first interlevel insulating layer 54 is formed thereon. Gate electrode 53G defines a channel region 51C in the active layer 51. Data line 55L is formed on the first interlevel insulating layer 54 to be connected to source region 51S through a contact hole formed in predetermined portions of the gate insulating layer 52 and the first interlevel insulating layer 54. Thereafter, a second interlevel insulating layer 56 is formed on the overall surface of the substrate. The pixel electrode 62 is formed on the second interlevel insulating layer 56 to be connected to drain region 51D through a contact hole formed in predetermined portions of the gate insulating layer 52 and the first and second interlevel insulating layers 54, 56. FIG. 6 also shows the cross-section of the storage capacitor constructed of the first storage electrode 61, the first and second interlevel insulating layers 54 and 56, gate insulating layer 52, and the pixel electrode 62.

Figure 7A:
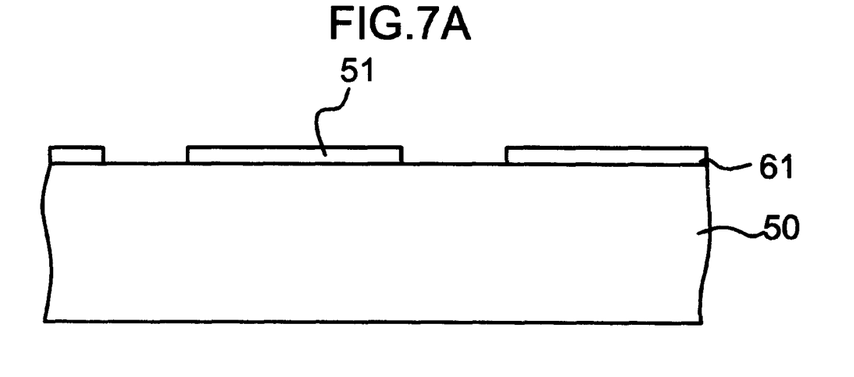
FIGS. 7A to 7E are cross-sectional views showing a process of fabricating the LCD of FIG. 5.

FIGS. 7A to 7E are cross-sectional views showing a process of fabricating the LCD shown in FIGS. 5 and 6. Referring to FIG. 7A, a silicon thin film is deposited on substrate 50 with a thickness of preferably 400 to 600 Å, and patterned to form the active layer 51 and the first storage electrode 61 through photolithography. Thus, the active layer 51 and the first storage electrode 61 are formed of the same material and at the same level. The first storage electrode 61 is formed over the entire pixel region except an area corresponding to the active layer 51, as shown in FIG. 5. The silicon thin film is formed of a semiconductor material, such as amorphous silicon or is polysilicon, by plasma enhanced chemical vapor deposition (PECVD), and is patterned by dry etching using a mixed gas of $CF_4+O_2$ or $C_2ClF_5+O_2$, for example.

Figure 7B:
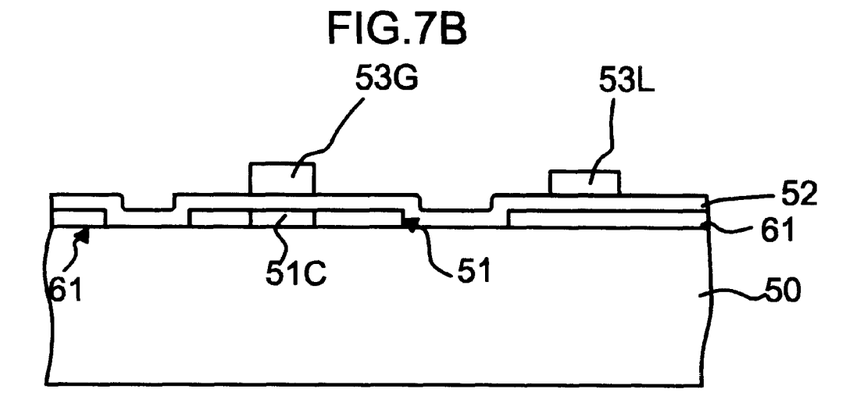

Referring to FIG. 7B, gate insulating layer 52 is formed with a thickness of preferably 800 to 1000 Å. The gate insulating layer 52 may be formed of an insulating material, such as silicon oxide or silicon nitride, by PECVD (insulating layers, which appear below, may also be formed by PECVD). A heavily doped polysilicon layer or metal thin film is formed on gate insulating layer 52 with a thickness of preferably 3000 to 4000 Å, and is patterned through photolithography, to form gate line 53L and gate electrode 53G connected thereto. The metal thin film may be formed of a metal such as chrome, aluminum, molybdenum, or their alloy (metal thin films which are described below may also be formed of these materials). The metal thin film can be patterned through wet etching using a strong acid solution (metal thin films which are described below may also be patterned using this method). Reference numeral 51C indicates a channel region of active layer 51 defined by gate electrode 53G.

Figure 7C:
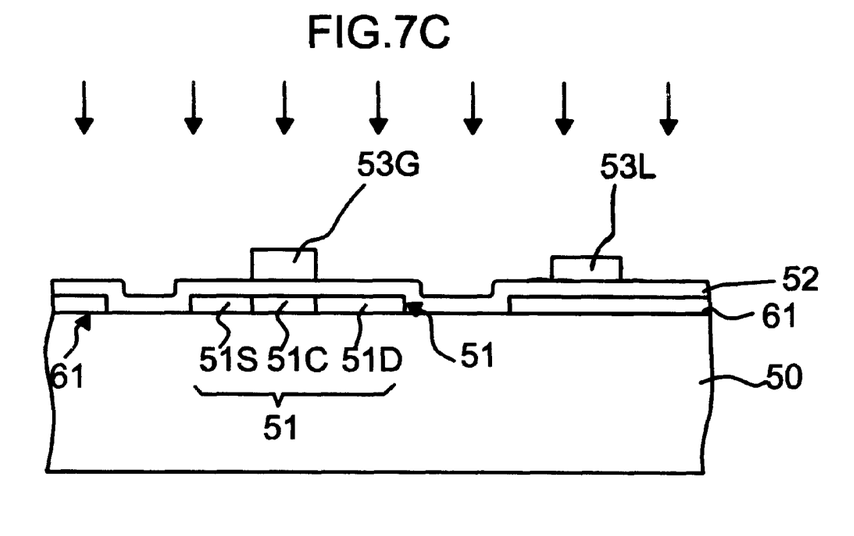

Referring to FIG. 7C, impurity ions are injected into the overall surface of the substrate. The impurity ions are injected into portions of active layer 51 and the first storage electrode 61 that are not shielded by gate line 53L and gate electrode 53G. The portion of active layer, into which the ions are injected, becomes source and drain regions 51S and 51D at both sides of channel region 51C. The ions injected into the first storage electrode 61 increase the conductivity thereof. Here, the ion doping uses n-type ions, which lead to a higher mobility of the resultant silicon layer than the case of p-type ions. P-type ions may be used when forming a p-type transistor. In general, phosphorus (P) or arsenic (As) is used as the n-type ion, and boron (B) is used as the p-type ion.

Figure 7D:
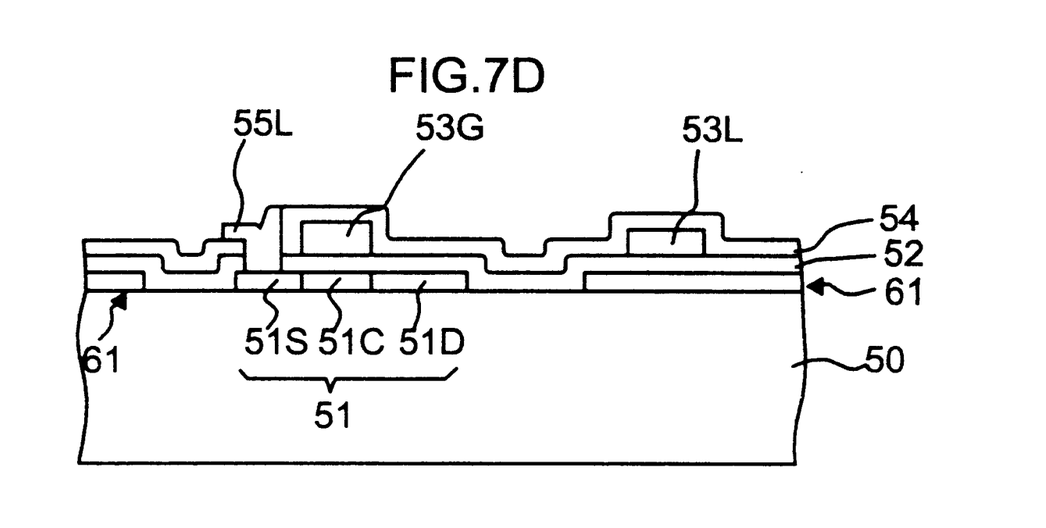

Referring to FIG. 7D, the first interlevel insulating layer 54 is formed on the overall surface of the substrate, and is patterned through dry etching using an $SF_6+O_2$/He or $C_2F_6+O_2$ gas, to selectively expose a portion of the gate insulating layer 52. Then, the exposed portion of gate insulating layer 52 is etched using the patterned first interlevel insulating layer 54 as a mask to form a contact hole in predetermined portions of the first interlevel insulating layer 54 and the gate insulating layer 52, which together expose a portion of the source region 51S. Thereafter, a metal thin film is formed on the overall surface of the substrate with a thickness of preferably 3000 to 5000 Å, and is patterned to form data line 55L in contact with the exposed portion of source region 51S.

Figure 7E:
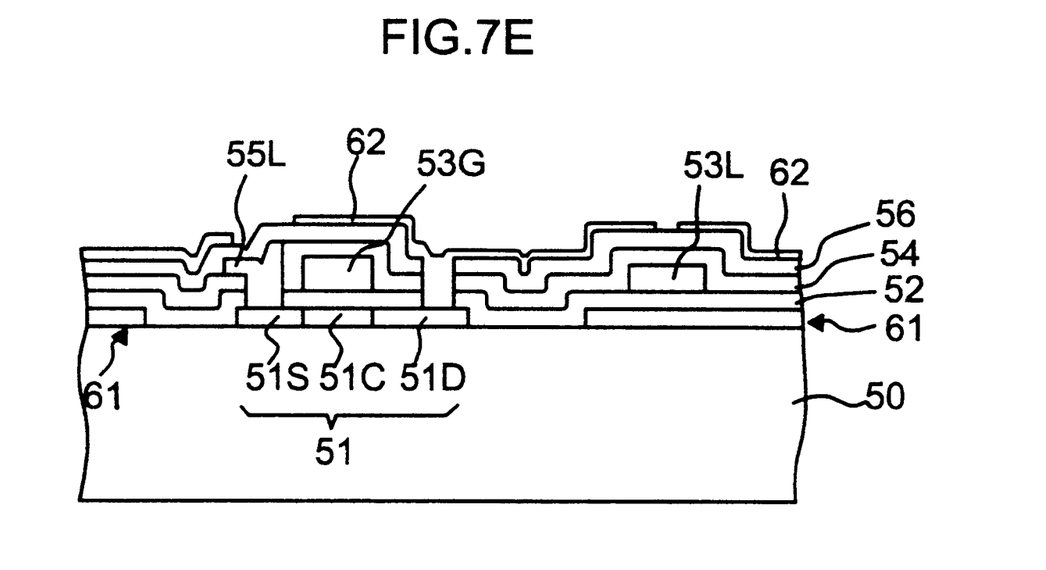

Referring to FIG. 7E, the second interlevel insulating layer 56 is formed on the overall surface of the substrate with a thickness of preferably 4000 to 5000 Å, and is patterned to expose a predetermined portion of the first interlevel insulating layer 54, under which drain region 60D is located. The exposed portion of the first interlevel insulating layer 54 is etched using the patterned second interlevel insulating layer 56 as a mask. Then, an exposed portion of the gate insulating layer 52 is etched using the patterned first interlevel insulating layer 54 as a mask to form a common contact hole in predetermined portions of the second interlevel insulating layer 56, the first interlevel insulating layer 54, and the gate insulating layer 52.

A transparent conductive layer is formed on the overall surface of the substrate with a thickness of preferably 1000 to 1500 Å, and is patterned through photolithography, to form a pixel electrode 62. The transparent conductive layer may be formed of a transparent conductive material, such as ITO, by sputtering and patterned by wet etching using a strong acid, such as a mixed solution of $FeCl_2+HCl+HNO_3$, for example.

The pixel electrode 62 is formed over almost the entire pixel region. The pixel electrode 62 forms a storage capacitor together with the first storage electrode 61 and the second and first interlevel insulating layers 56, 54, which are located below the pixel electrode and formed over the entire pixel region. That is, the pixel electrode is used as the second storage electrode. As a result, the storage capacitor includes the first storage electrode 61 and the second storage electrode, which are formed over almost the entire pixel region. Since these electrodes are transparent with respect to light, this configuration does not reduce the aperture ratio.

Although the thin film transistor of the aforementioned LCD employs a top gate structure, the present invention can be applied to other structures as long as the active layer and the first storage electrode can be formed of the same material and the pixel electrode can be used as the second storage electrode for a storage capacitor.

The LCD of the present invention has an aperture ratio much higher than that of the conventional LCDs, because the first and second storage electrodes are both formed of transparent conductive materials, and the thus constructed storage capacitor covers almost the entire pixel region. Accordingly, it is possible to reduce the power consumption of the back light.

It will be apparent to those skilled in the art that various modifications and variations can be made in the liquid crystal display and the method of fabricating the same of the present invention without departing from the spirit or scope of the invention. Thus, it is intended that the present invention cover the modifications and variations of this invention provided they come within the scope of the appended claims and their equivalents.

What is claimed is:

1. A liquid crystal display, comprising:
   a substrate;
   a plurality of gate lines over the substrate;
   a plurality of data lines crossing the plurality of gate lines over the substrate;
   a plurality of switching elements each having an active layer formed of a semiconductor material over the substrate and connected to the gate line and the data line, signals from the gate lines controlling an operation of the switching elements;
   a plurality of pixel electrodes each respectively connected to each of the plurality of switching elements, signals from the data lines being transmitted to the pixel electrodes in accordance with the operation of the switching elements;
   a plurality of storage electrodes positioned opposite to the pixel electrodes, the storage electrodes being formed over the substrate of the same semiconductor material as that of the active layers such that the plurality of storage electrodes are substantially transparent; and
   at least one dielectric layer between the storage electrode and the pixel electrode, the storage electrode and the pixel electrode along with the at least one dielectric layer defining a storage capacitor, wherein each storage electrode substantially covers an entire corresponding pixel region excluding a region where the respective switching element is formed.

2. The liquid crystal display according to claim 1, wherein the active layer includes a semiconductor material having one of amorphous silicon and polysilicon.

3. The liquid crystal display according to claim 1, wherein the switching element includes a thin film transistor having source and drain regions and a gate insulating layer and a gate electrode.

4. A thin film transistor array for use in a liquid crystal display, comprising:
   a substrate;
   a gate line over the substrate;
   a data line over the substrate;
   a thin film transistor over the substrate, including:
      an active layer having source and drain regions therein, the active layer being made of a semiconductor material, the source region being connected to the data line;
      a gate electrode connected to the gate line; and
      a gate insulating layer between the gate electrode and the active layer;
   a pixel electrode connected to the drain region of the active layer;
   a storage electrode disposed opposite to the pixel electrode and made of the same semiconductor material as the active layer, the storage electrode being substantially transparent with respect to a radiation; and
   a dielectric layer between the pixel electrode and the storage electrode, the pixel electrode and the storage electrode along with the dielectric layer defining a capacitor, wherein the storage electrode is formed over substantially an entire pixel region.

5. A thin film transistor array substrate according to claim 4, wherein the semiconductor material includes amorphous silicon.

6. A thin film transistor array substrate according to claim 4, wherein the semiconductor material includes polycrystalline silicon.

7. The thin film transistor array substrate according to claim 4, wherein the storage electrode is substantially transparent with respect to visible light.

8. The thin film transistor array substrate according to claim 4, wherein an area defined by the storage electrode is substantially the same as an area defined by the pixel electrode.

9. The thin film transistor array substrate according to claim 4, wherein the gate insulating layer is between the storage electrode and the pixel electrode.

10. The thin film transistor array substrate according to claim 4, wherein the dielectric layer includes a first insulating layer over the active layer and the storage electrode and a second insulating layer over the first insulating layer,
    wherein the data line is over the first insulating layer and connected to the source region through a contact hole in the first insulating layer, and
    wherein the pixel electrode is over the second insulating layer and connected to the drain region through a contact hole in the first and second insulating layers.

11. The thin film transistor array substrate according to claim 4, wherein the thickness of the storage electrode is less than 600 Å.

12. The thin film transistor array substrate according to claim 11, wherein the thickness of the storage electrode is more than 400 Å.

13. The thin film transistor array according to claim 4, wherein active layer and the storage electrode are both formed directly on a surface of the substrate.

14. The thin film transistor array according to claim 4, wherein active layer and the storage electrode are formed at a same layer with respect to the substrate.

15. The thin film transistor array according to claim 4, wherein the active layer and the storage electrode are both formed of a silicon thin film having a thickness between 400 Å and 600 Å.

16. The thin film transistor array according to claim 4, wherein the substrate includes a glass substrate.

17. A method of fabricating a liquid crystal display on a substrate, the method comprising the steps of:

simultaneously forming an active layer and a storage electrode over the substrate, the active layer and the storage electrode being made of a same semiconductor material being substantially transparent;

forming a first insulating layer over an overall surface of the substrate;

forming a gate electrode and a gate line connected to the gate electrode over the first insulating layer, the gate electrode crossing the active layer;

doping impurities into predetermined portions of the active layer and the storage electrode using the gate electrode and the gate line as a mask, the impurity-doped portions of the active layer defining source and drain regions at sides of the active region relative to the gate electrode;

forming a second insulating layer over an overall surface of the substrate;

forming a first contact hole in predetermined portions of the first and second insulating layers to expose a portion of the source region;

forming a data line over the second insulating layer, the data line being connected to the source region through the first contact hole;

forming a third insulating layer on an overall surface of the substrate;

forming a second contact hole in predetermined portions of the first, second, and third insulating layers to expose a portion of the drain region; and forming a pixel electrode opposite to the storage electrode over the third insulating layer, the pixel electrode being connected to the drain region through the second contact hole, wherein the storage electrode is formed over substantially an entire pixel region.

18. The method according to claim 17, wherein the step of doping impurities includes the step of doping N-type impurity-ions.

19. The method according to claim 17, wherein the step of doping impurities includes the step of doping P-type impurity-ions.

20. The method according to claim 17, wherein the step of forming the active layer and the storage electrode includes the steps of depositing amorphous silicon over the substrate; and patterning the amorphous silicon to form the active layer and the storage electrode.

21. The method according to claim 17, wherein the step of forming the active layer and the storage electrode includes the steps of:

depositing polycrystalline silicon over the substrate; and patterning the polycrystalline silicon to form the active layer and the storage electrode.

22. The method according to claim 17, wherein the step of forming the active layer and the storage electrode includes the step of forming the storage electrode with a thickness of less than 600 Å.

23. The method according to claim 17, wherein the active layer and the storage electrode are concurrently formed.

24. The method according to claim 17, wherein active layer and the storage electrode are both formed directly on a surface of the substrate.

25. The method according to claim 17, wherein active layer and the storage electrode are formed at a same layer with respect to the substrate.

26. The method according to claim 17, wherein the active layer and the storage electrode are both formed of a silicon thin film having a thickness between 400 Å and 600 Å.

27. The method according to claim 17, wherein the substrate includes a glass substrate.

* * * * *